US010777411B1

(12) United States Patent
Nguyen et al.

(10) Patent No.: US 10,777,411 B1
(45) Date of Patent: Sep. 15, 2020

(54) SEMICONDUCTOR DEVICE WITH SELECTIVE DIELECTRIC DEPOSITION

(71) Applicant: International Business Machines Corporation, Armonk, NY (US)

(72) Inventors: Son Nguyen, Schenectady, NY (US); Benjamin D. Briggs, Waterford, NY (US); Huai Huang, Saratoga, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/427,779

(22) Filed: May 31, 2019

(51) Int. Cl.
*H01L 21/027* (2006.01)
*H01L 21/02* (2006.01)

(52) U.S. Cl.
CPC .... *H01L 21/0271* (2013.01); *H01L 21/02118* (2013.01); *H01L 21/02282* (2013.01); *H01L 21/02348* (2013.01)

(58) Field of Classification Search
CPC .......... H01L 21/0271; H01L 21/02118; H01L 21/02282; H01L 21/02348
See application file for complete search history.

(56) References Cited

U.S. PATENT DOCUMENTS

| | | | |
|---|---|---|---|
| 6,114,099 A * | 9/2000 | Liu | B01J 19/0046 427/258 |
| 10,047,435 B2 | 8/2018 | Haukka et al. | |
| 10,192,752 B2 | 1/2019 | Kaufman-Osborn et al. | |
| 2004/0183069 A1 * | 9/2004 | Afzali-Ardakani | H01L 51/0595 257/40 |
| 2018/0012752 A1 | 1/2018 | Tapily | |
| 2018/0323102 A1 | 11/2018 | Redzheb et al. | |
| 2018/0366317 A1 | 12/2018 | Ke et al. | |
| 2019/0017170 A1 | 1/2019 | Sharma et al. | |
| 2020/0020580 A1 * | 1/2020 | Lee | H01L 21/31053 |

OTHER PUBLICATIONS

R. Loo et al., "Processing Technologies for Advanced Ge Devices," ECS Journal of Solid State Science and Technology, Oct. 2-7, 2016, pp. 14-20, vol. 6, No. 1.
A.J.M. Mackus et al., "The Use of Atomic Layer Deposition in Advanced Nanopatterning," Nanoscale, Jul. 2014, 22 pages, vol. 6, No. 19.
A.H. Simon et al., "Electromigration Comparison of Selective CVD Cobalt Capping with PVD Ta(N) and CVD Cobalt Liners on 22nm-Groundrule Dual-Damascene Cu interconnects," IEEE International Reliability Physics Symposium (IRPS), Apr. 14-18, 2013, 6 pages.

(Continued)

*Primary Examiner* — Peniel M Gumedzoe
(74) *Attorney, Agent, or Firm* — Vazken Alexanian; Ryan, Mason & Lewis, LLP

(57) ABSTRACT

Techniques are provided to fabricate semiconductor devices. For example, a semiconductor device can include a substrate including a central portion and a pair of outer portions. A first self-assembled monolayer is attached to the central portion of the substrate. A second self-assembled monolayer is attached to the first self-assembled monolayer. A first dielectric layer is disposed on each of the outer portions. A second dielectric layer is disposed on the first dielectric layer.

18 Claims, 5 Drawing Sheets

(56) References Cited

OTHER PUBLICATIONS

Lei Guo, "Selective Chemistry of Metal Oxide Atomic Layer Deposition on Si Based Substrate Surfaces," UC Riverside Electronic Theses and Dissertations, Mar. 2015, 120 pages.

F.S.M. Hashemi et al., "Area Selective Atomic Layer Deposition of Metal Oxides on Metal-Dielectric Patterns," Dissertation, Stanford University, Department of Materials Science and Engineering and the Committee on Graduate Studies, Aug. 2016, 261 pages.

A. Summerfield et al., "Nucleation and Early Stages of Layer-by-Layer Growth of Metal Organic Frameworks on Surfaces," The Journal of Physical Chemistry, Sep. 24, 2015, pp. 23544-23551, vol. 119, No. 41.

A. Rezvanov et al., "Area Selective Grafting of Siloxane Molecules on Low-k Dielectric with Respect to Copper Surface," Applied Surface Science, Jan. 9, 2019, pp. 317-324, vol. 476.

D. Aureau et al., "Controlled Deposition of Gold Nanoparticles on Well-Defined Organic Monolayer Grafted on Silicon Surfaces," The Journal of Physical Chemistry, Aug. 2, 2010, pp. 14180-14186, vol. 114, No. 33.

A. Mameli et al., "Area-Selective Atomic Layer Deposition of $SiO_2$ Using Acetylacetone as a Chemoselective Inhibitor in an ABC-Type Cycle," American Chemical Society, ACS Nano, Aug. 29, 2017, 9 pages.

F.S.M. Hashemi et al., "Self-Correcting Process for High Quality Pattering by Atomic Layer Deposition," ACS Nano, Jul. 16, 2015, pp. 8710-8717, vol. 9, No. 9.

\* cited by examiner

FIG. 3A
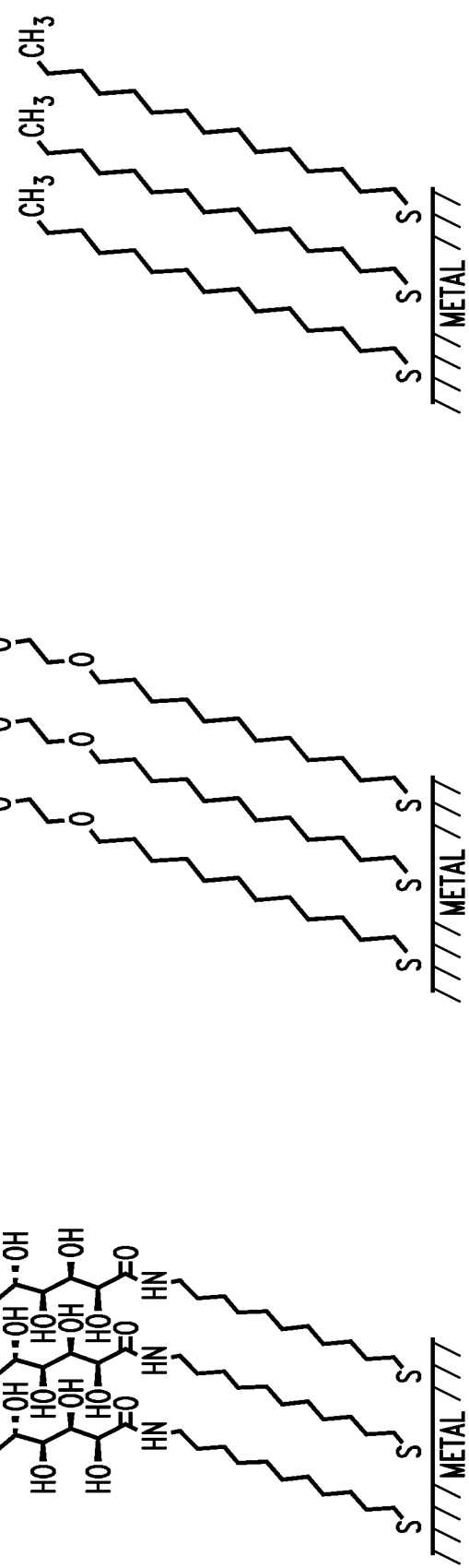
FIG. 3B
FIG. 3C
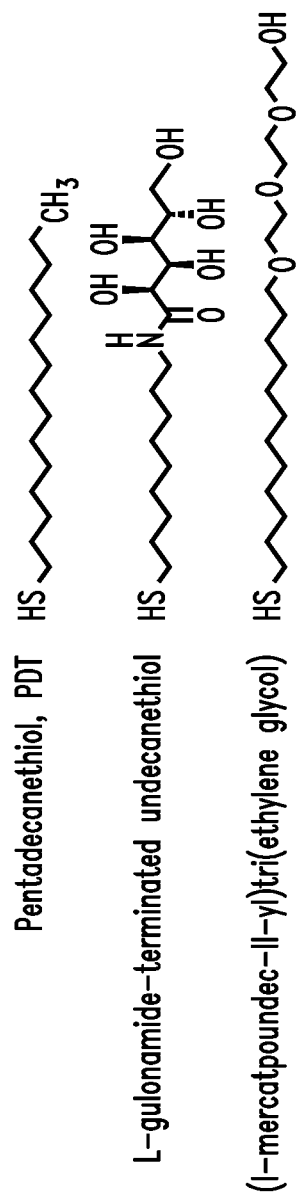
Pentadecanethiol, PDT
L-gulonamide-terminated undecanethiol
(1-mercatpoundec-11-yl)tri(ethylene glycol)

SEMICONDUCTOR DEVICE WITH SELECTIVE DIELECTRIC DEPOSITION

BACKGROUND

As the semiconductor device industry moves towards the 10 nanometers (nm) technology node and beyond, the complexity in manufacturing is increasing. The cost to produce semiconductor devices is also increasing and cost-effective solutions and innovations are needed. As smaller transistors are manufactured, the critical dimension (CD) or resolution of patterned features is becoming more challenging to produce. Self-aligned patterning may replace overlay-driven patterning so that cost-effective scaling can continue even after extreme ultraviolet lithography (EUV) introduction. Selective deposition of thin films is a key step in patterning in highly scaled technology nodes.

Selective film deposition has been achieved through the use of self-assembled monolayers (SAMs). SAMs may be utilized as a masking material to improve subsequent material deposition selectivity. SAMs are generally surface chemistry dependent and can be formed preferentially on various materials.

SUMMARY

Embodiments described herein provide methods of forming semiconductor devices with a selective insulator for improved capacitance.

For example, one exemplary embodiment includes a method for forming a semiconductor device. The method comprises contacting a portion of a substrate with a first self-assembled monolayer forming molecule to attach a first self-assembled monolayer to the portion of the substrate. The first self-assembled monolayer forming molecule includes a surface binding head group for attachment to the portion of the substrate and a binding tail group for attachment to a second self-assembled monolayer forming molecule. The method further comprises selectively depositing a first dielectric layer on the remaining portion of the substrate. The method further comprises contacting the first self-assembled monolayer with the second self-assembled monolayer forming molecule to attach the second self-assembled monolayer to the first self-assembled monolayer. The second self-assembled monolayer forming molecule includes a surface binding head group for attachment to the binding tail group of the first self-assembled monolayer forming molecule and a binding tail group for attachment to a third self-assembled monolayer forming molecule. The method further comprises selectively depositing a second dielectric layer on the first dielectric layer.

Another exemplary embodiment includes a semiconductor device which comprises a substrate comprising a central portion and a pair of outer portions. A first self-assembled monolayer is attached to the central portion of the substrate. A second self-assembled monolayer is attached to the first self-assembled monolayer. A first dielectric layer is disposed on each of the outer portions. A second dielectric layer is disposed on the first dielectric layer.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 3A shows modification of a metal layer of a substrate with a first SAM layer, in accordance with an illustrative embodiment.

FIG. 3B shows modification of a metal layer of a substrate with a first SAM layer, in accordance with an illustrative embodiment.

FIG. 3C shows modification of a metal layer of a substrate with a first SAM layer, in accordance with an illustrative embodiment.

DETAILED DESCRIPTION

Figure 1:
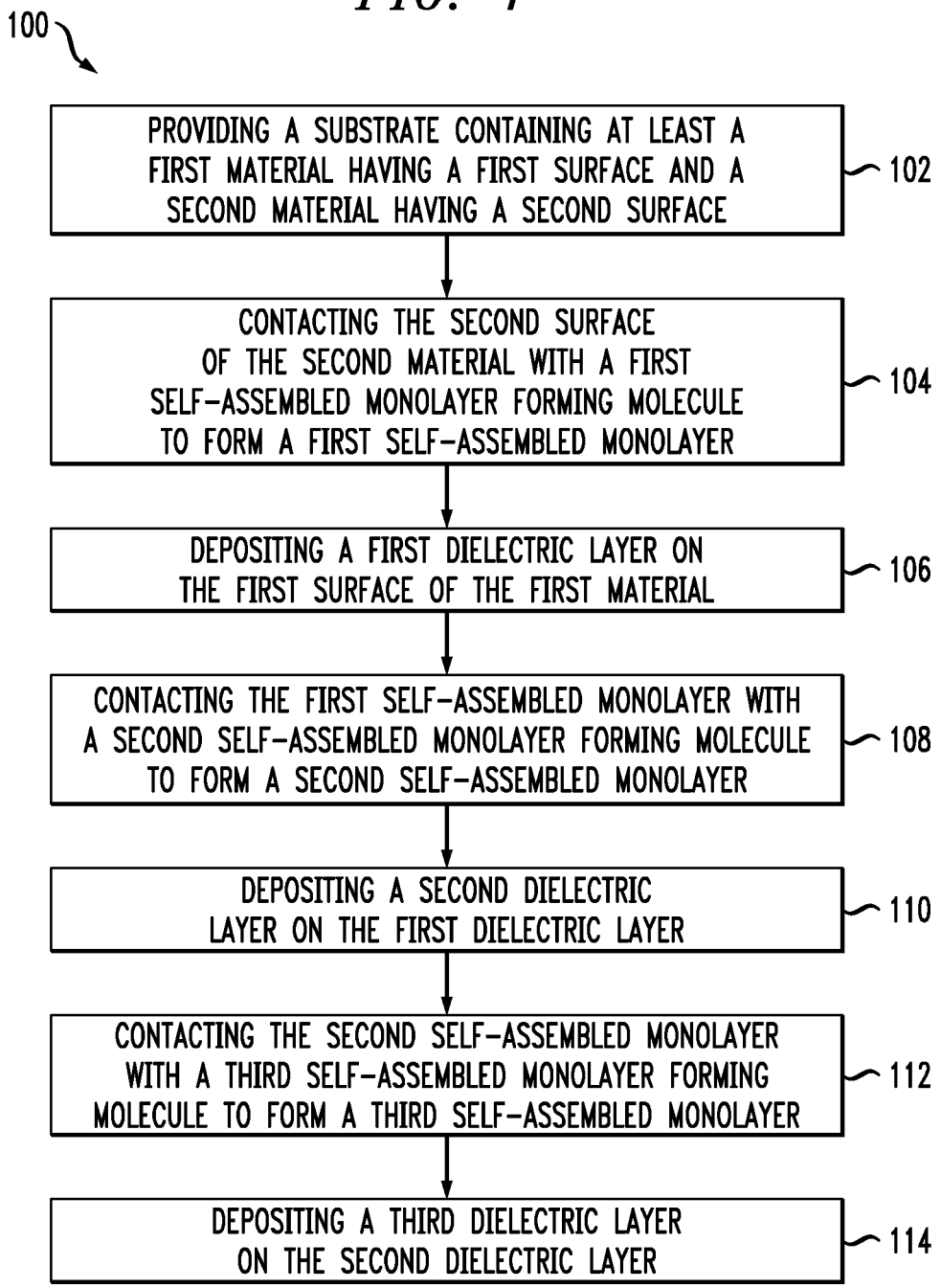
FIG. 1 shows a process flow for selective film deposition on a substrate, in accordance with one illustrative embodiment.

Embodiments of the present invention generally relate to a method of selective deposition of dielectric material onto a surface of a semiconductor substrate. In particular, embodiments of the present invention generally relate to selectively depositing a dielectric layer having a relatively low dielectric constant on top of another dielectric layer using self-assembled monolayer ("SAM") molecules. The deposition schemes presently used for depositing a dielectric layer having a relatively low dielectric constant on top of another dielectric layer fail to provide a solution to deposit dielectric layers selectively on another dielectric layer as lateral deposition of the dielectric is a problem that will impact the implementation of thicker selective dielectric growth. Accordingly, embodiments of the present invention provide a solution to depositing a dielectric layer onto another dielectric layer using directional surface activation and deactivation (i.e., passivation molecules) with a cyclic process. The process attaches long chain and/or connective surface SAM molecules to inhibit lateral growth of the dielectric layers. Thus, by using a multiple cyclic SAM molecule grafting and selective dielectric layer deposition process of the present invention, thicker dielectric layers and longer solid SAM molecules can be grafted/attached in a dense structure to prevent/minimize unwanted lateral growth of dielectric layers and may allow different types of selective dielectric growth in the same pattern.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2A:
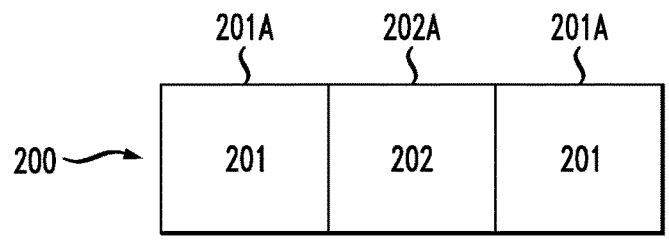
FIG. 2A schematically shows a cross-sectional view of selective film deposition on a substrate, in accordance with an illustrative embodiment.

FIG. 1 shows a process flow 100 for selective film deposition on a substrate according to an illustrative embodiment of the invention. Referring also to FIG. 2A, the process flow 100 includes, in step 102, providing a substrate 200 containing at least a first material 201 having a first surface 201A and a second material 202 having a second surface 202A. However, it is to understood that the substrate can contain one material having a first surface, i.e., where the first material and the second material are the same material as described below. In the embodiment shown in FIG. 2A, the first surface 201A and the second surface 202A are horizontal surfaces that lie at least substantially in the same plane.

The first material 201 includes a dielectric material. For example, the first material 201 can contain $SiO_2$, a low-k dielectric material, an ultra low-k dielectric material, or a high-k dielectric material. Low-k dielectric materials have a nominal dielectric constant less than the dielectric constant of $SiO_2$, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material.

Ultra low-k dielectric materials have a nominal dielectric constant less than 2.5. Suitable ultra low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSiCOH and the like.

In some case, high k dielectric material may also be used in this structure alone or in combination with the low k and ultralow k dielectrics. High-k dielectric materials have a nominal dielectric constant greater than the dielectric constant of $SiO_2$. Suitable high-k dielectric materials include, for example, silicon nitride (SiN), silicon oxynitride, silicon carbon nitride (SiCN), silicon carbide (SiC), and metal oxides such as aluminum oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The second material 202 includes a metal-containing material that excludes a metal oxide. Suitable metal-containing materials include, for example, W, Cu, Co, Ru, Ta, Rh, Mo, Pt, Ni, TiN, TaN, TaSiN, TiSiN, CoSi, TiSi, NiSi, WCN and a combination thereof.

Figure 2B:
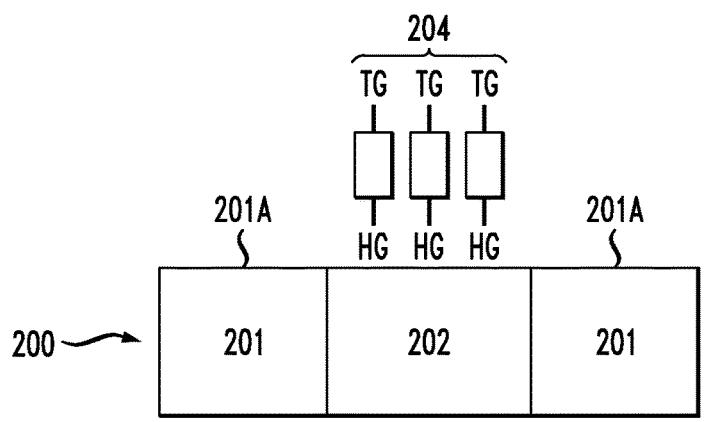
FIG. 2B schematically shows a cross-sectional view of selective film deposition on a substrate, in accordance with an illustrative embodiment.

The process flow 100 further includes, in step 104, contacting the second surface 202A with a first SAM molecule to form a SAM layer 204 on the second surface 202A, as shown in FIG. 2B. As one skilled in the art will understand, SAM layers will include organic molecular species having (1) a surface binding group ("functional head group"), denoted as "HG" in FIGS. 2B-2G, capable of interacting with the surface of the underlying layer, i.e., the first or second material, e.g., a dielectric or metal layer, of the substrate to form a monolayer on the surface of the substrate, as well as capable of interacting with a functional tail group of another SAM layer; and (2) a functional tail group, denoted as "TG" in FIGS. 2B-2G, capable of interacting with the functional head group of another SAM layer. For example, the monolayers are stabilized by the chemisorption of the functional head group to the surface and the formation of covalent bonds (in the case of silanes or thiols) or ionic bonding (in the case of alkenes and acids) of the terminal head group, as well as intermolecular interactions between the molecules such as van der Waals forces, pi-pi bonding interactions or hydrogen bonding.

Representative examples of functional head groups that can be designed into organic molecules for interacting with or binding to a particular substrate surface with chemical specificity include one or more of the same or different functional groups, such as phosphines, phosphonic acids, carboxylic acids, thiols, epoxides, amines, imines, hydroxamic acids, phosphine oxides, phosphites, phosphates, phosphazines, azides, hydrazines, sulfonic acids, sulfides, disulfides, aldehydes, ketones, silanes, germanes, arsines, nitriles, isocyanides, isocyanates, thiocyanates, isothiocyanates, amides, alcohols, selenols, nitros, boronic acids, ethers, thioethers, carbamates, thiocarbamates, dithiocarbamates, dithlocarboxylates, xanthates, thioxanthates, alkylthiophosphates, dialkyldithiophosphates or a combination thereof. The tail groups can be any of the head groups, as well as a hydrocarbon, a partially halogenated hydrocarbon, a fully halogenated hydrocarbon or a combination thereof. The hydrocarbon or the halogenated hydrocarbon can be any aliphatic or aromatic or can have a combination of aliphatic and aromatic groups. The halogen in the partially or fully halogenated hydrocarbon can be one or more of fluorine, chlorine, bromine or iodine.

In one embodiment, a suitable SAM molecule for forming the SAM layers includes any of the following structures:

a thiol of the formula: R—SH;
a silane of the formula: $(R)_{4-a}$—$Si(Cl)_a$, wherein a is 1 to 3;
an alkene of the formula: R—C(H)=CH$_2$;
a carboxylic acid of the formula: R—COOH; and
a phosphonic acid of the formula: R—PO$_3$H$_3$,
wherein R is a $C_1$ to $C_{24}$ aliphatic group or a $C_{12}$ to $C_{22}$ aliphatic group with or without unsaturation and optionally containing one or more heteroatoms, e.g., —O—, and having a functionalized terminal end group such as, for example, a hydroxyl-containing end group (e.g., a —CH$_2$OH group), an amine-containing end group, a carboxylic acid-containing end group (e.g., a —COOH group), a thiol-containing end group and a —CH$_3$ containing end group to vary the wetting and interfacial properties.

Representative examples of SAM molecules for use herein include a chlorosilane molecule such as, for example, methyltrichlorosilane, ethyltrichlorosilane, propyltrichlorosilane, butyltrichlorosilane, pentyltrichlorosilane, hexyltrichlorosilane, heptyltrichlorosilane, octyltrichlorosilane, nonyltrichlorosilane, decyltrichlorosilane, undecyltrichlorosilane, and dodecyltrichlorosilane, a thiol molecule such as, for example, pentadecanethiol, L-gulonamide-terminated undecanethiol, (1-mercaptoundecyl)tri(ethylene glycol), trimethyl silyl dimethyl amine and (trimethoxy) silyl dimethyl amine, fluorosilanes, and fluorocarbon and hydrocarbon groups bonded to phosphonic acid or carboxylic acid terminal groups.

In general, SAM layers 204 are formed by placing substrate 200 in a solution containing the SAM molecules for forming the monolayer in a non-reactive, low boiling solvent for a time period sufficient to form the SAM layers. In one embodiment, a low boiling solvent can be, for example, an aromatic nonpolar hydrocarbon such as toluene or xylene, or a polar low molecular weight alcohol such as a $C_1$ to $C_{13}$ monoalcohol, e.g., methanol, ethanol and isopropanol, and the like at about 25° C. to about 50° C. Substrate 200 can be placed in the solution containing the SAM molecules for a time sufficient to form the SAM layers. In one embodiment, a time period sufficient enough to form the SAM layers can be a bonding time of from about 5 second to about 48 hours. In one embodiment, a time period sufficient enough to form the SAM layers can be a bonding time of about 0.1 to about 1 hour. The thickness of the first SAM layer 204 may vary depending on the deposition process as well as the composition and SAM material used to bond to the surface. In one embodiment, the thickness of the first SAM layer 204 can typically range from about 0.3 nm to about 4 nm. After the SAM bonding, UV cure can be used to create cross-linking bonding between SAMs to strengthen the vertical strength and orientation of the SAM molecules vertical cross-linking bonding.

In general, the SAM layers 204 are formed in a vertical orientation to inhibit lateral growth when depositing dielectric layer 206 on each of the first surfaces 201A as discussed below. An exemplary embodiment of a SAM layer attached to a substrate can be seen in FIGS. 3A-3C. For example, FIG. 3A shows the SAM layer derived from pentadecanethiol attached to a metal (e.g., copper/gold) surface of a substrate. FIG. 3B shows the SAM layer derived from L-gulonamide-terminated undecanethiol attached to a metal surface of a substrate. FIG. 3C shows the SAM layer derived from (1-mercaptoundecyl)tri(ethylene glycol) attached to a metal surface of a substrate.

Figure 2C:
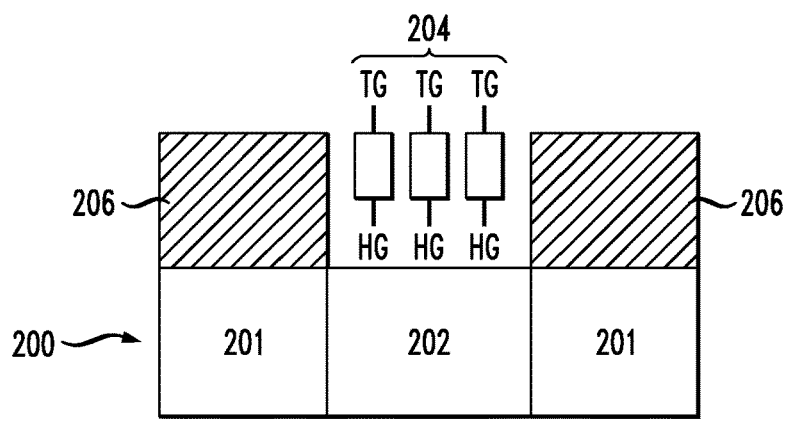
FIG. 2C schematically shows a cross-sectional view of selective film deposition on a substrate, in accordance with an illustrative embodiment.

The process flow 100 further includes, in step 106, depositing a dielectric layer 206 on each of the first surfaces 201A, as shown in FIG. 2C. Suitable dielectric material for each of dielectric layers 206 includes any of the dielectric materials discussed above for first material 201. Dielectric layers 206 can be deposited using known methods such as, for example, atomic layer deposition (ALD), chemical vapor deposition (CVD), physical vapor deposition (PVD), plasma enhanced chemical vapor deposition (PECVD), chemical solution deposition or other like processes plating. The top surfaces of dielectric layer 206 can then be planarized by, for example, a planarization process such as a chemical mechanical planarization (CMP). The thickness of the dielectric material may vary depending on the deposition process as well as the composition and dielectric material used. In one embodiment, the thickness of dielectric layers 206 can range from about 2 nm to about 300 nm.

Figure 2D:
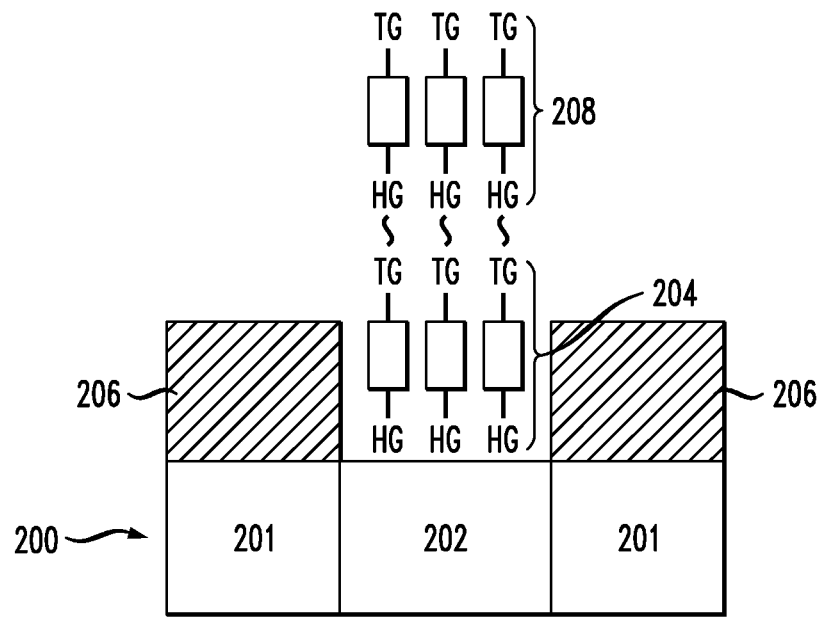
FIG. 2D schematically shows a cross-sectional view of selective film deposition on a substrate, in accordance with an illustrative embodiment.

The process flow 100 further includes, in step 108, contacting the first SAM layer 204 with a second SAM molecule to form a second SAM layer 208, as shown in FIG. 2D. The second SAM molecule for forming second SAM layer 208 can be the same or different as the first SAM molecule and includes any of the SAM molecules discussed above. In general, the functional head group of the second SAM molecule will attach to the functionalized terminal end group of the first SAM layer 204. This is carried out by the bonding to the head of one SAM molecule to the terminal group of the other SAM molecule. For example, a siloxane with a —Si—OH terminal head group can bond to a silane (Si—H) group or a methyl/ethyl silane (—R—CH$_3$ or —R—C$_2$H$_5$) terminal group. This can be carried out by using thermal ambient or UV activated reactions to form one of the following bonding reactions with R as a functional long chain terminal group as defined above:

R—Si—OH+H—Si—R/bonded to metal →R—Si—Si—R/bonded to metal+H$_2$O.

R—Si—CH$_3$+HO—Si—R/bonded to metal →R—Si—CH$_2$—Si—R/bonded to metal+H$_2$O.

R—Si—CH$_3$+HO—Si—R/bonded to metal →R—Si—Si—R/bonded to metal+CH$_3$OH.

R—Si—CH$_3$+HO—Si—R/bonded to metal →R—Si—CH$_2$—Si—R/bonded to metal+H$_2$O.

R—Si—C$_2$H$_5$+HO—Si—R/bonded to metal →R—Si—CH$_2$—Si—R/bonded to metal+CH$_3$OH.

Other less reactive reactions:

R—Si—CH$_2$—OH+H—Si—R/bonded to metal →R—Si—CH$_2$—Si—R/bonded to metal+H$_2$O.

R—Si—CH$_2$—OH+H—Si—R/bonded to metal →R—Si—Si—R/bonded to metal+CH$_3$O.

R—Si—R$_1$—OH+H—Si—R/bonded to metal →R—Si—Si—R/bonded to metal+R$_1$—OH;

R$_1$ is a terminal group, e.g., a hydrocarbon group such as C$_x$H$_y$, where, for example, x is 1 to 4, and y is 3 to 12 (e.g., —CH$_3$, —C$_2$H$_6$). However, as one skilled in the art will understand R$_1$ can be varied to provide additional bonding group for subsequent SAM bonding.

For example, other similar reactions with terminal groups such as —Si—H, —Si—OH, and —Si—C$_x$H$_y$, where, for example, x is 1 to 4, and y is 3 to 12, can also be employed.

In one embodiment, the thickness of the second SAM layer 208 can typically range from about 0.3 nm to about 4 nm.

Figure 2E:
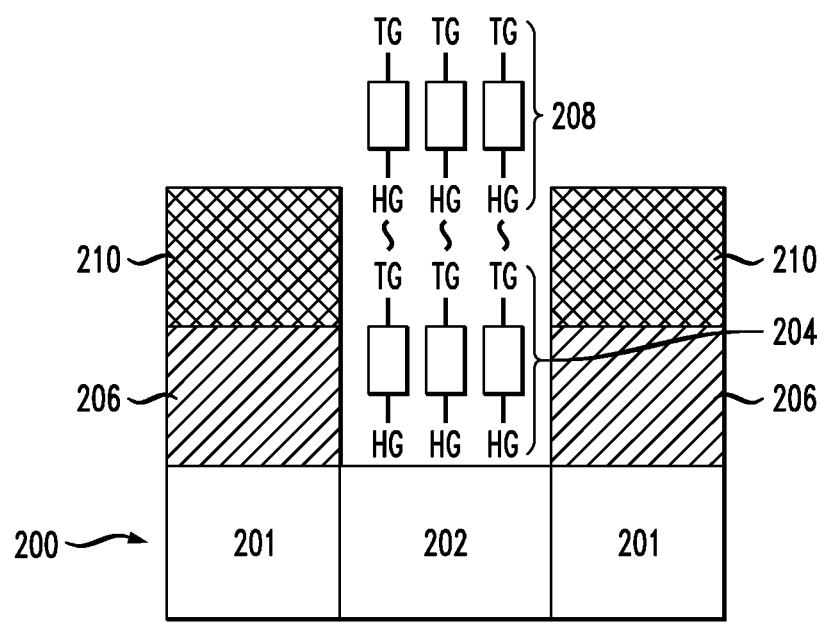
FIG. 2E schematically shows a cross-sectional view of selective film deposition on a substrate, in accordance with an illustrative embodiment.

The process flow 100 further includes, in step 110, depositing a dielectric layer 210 on each of dielectric layers 206, as shown in FIG. 2E. Suitable dielectric material for each of dielectric layers 210 includes any of the dielectric material discussed above for first material 201. Dielectric layers 210 can be deposited using known methods such as, for example, ALD, CVD, PVD, PECVD, chemical solution deposition or other like processes plating. The top surfaces of dielectric layer 210 can then be planarized by, for example, CMP. In one embodiment, the thickness of dielectric layer 210 can range from about 1 to about 300 nm. In one embodiment, the thickness of dielectric layer 210 can range from about 3 to about 15 nm.

Figure 2F:
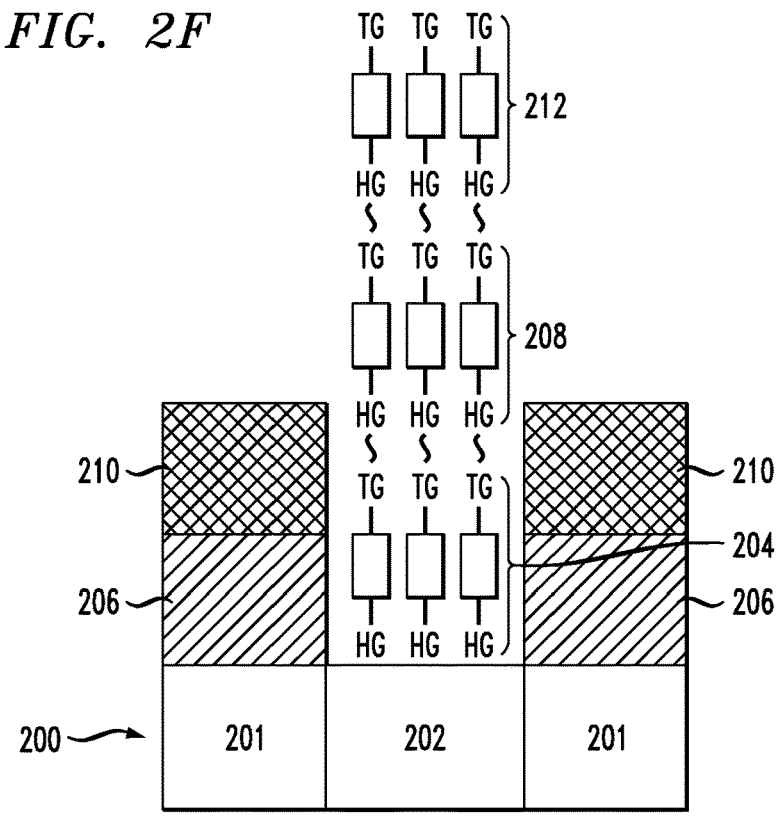
FIG. 2F schematically shows a cross-sectional view of selective film deposition on a substrate, in accordance with an illustrative embodiment.

The process flow 100 further includes, in step 112, contacting the second SAM layer 208 with a third SAM molecule to form a third SAM layer 212, as shown in FIG. 2F. The third SAM molecule for forming third SAM layer 212 can be the same or different as the first and second SAM molecules and includes any of the SAM molecules discussed above. In general, the functional head group of the third SAM molecule will attach to the functionalized terminal end group of the second SAM layer 208. This is carried out by typical thermal and UV assisted reactions. As discussed above, this can be carried out by using thermal ambient or UV activated reactions to form one of the following bonding reactions with R as a functional long chain terminal group as defined above:

R$_2$—Si—OH+H—Si—R/bonded to metal →R$_2$—Si—Si—R/bonded to metal+H$_2$O.

R$_2$—Si—CH$_3$+HO—Si—R/bonded to metal →R$_2$—Si—CH$_2$—Si—R/bonded to metal+H$_2$O.

R$_2$—Si—CH$_3$+HO—Si—R/bonded to metal →R$_2$—Si—Si—R/bonded to metal+CH$_3$OH.

R$_2$—Si—CH$_3$+HO—Si—R/bonded to metal →R$_2$—Si—CH$_2$—Si—R/bonded to metal+H$_2$O.

R$_2$—Si—C$_2$H$_5$+HO—Si—R/bonded to metal →R$_2$—Si—CH$_2$—Si—R/bonded to metal+CH$_3$OH.

Other less reactive reactions:

R$_2$—Si—CH$_2$—OH+H—Si—R/bonded to metal →R$_2$—Si—CH$_2$—Si—R/bonded to metal+H$_2$O.

R$_2$—Si—CH$_2$—OH+H—Si—R/bonded to metal →R$_2$—Si—Si—R/bonded to metal+CH$_3$O.

R$_2$—Si—R$_1$—OH+H—Si—R/bonded to metal →R$_2$—Si—Si—R/bonded to metal+R$_1$—OH.

R$_2$ is a SAM molecule with terminal groups such as C$_x$H$_y$, where, for example, x is 1 to 4, and y is 3 to 12 (e.g., —CH$_3$, —C$_2$H$_6$), —OH, —Si—OH, —Si—H, —Si—CH$_3$, and —Si—CH$_2$—OH.

The R groups in the second SAM bonding step can be the same as or different from the R groups in R—Si—R/R—Si—Si—R/R—Si—CH$_2$—Si—R or R$_1$—Si—R and related groups bonded to metal as described above.

As one skilled in the art will readily appreciate, other similar reactions with terminal —Si—H, —Si—OH, —Si—C$_x$H$_y$ can also be employed to continue the additional SAM bonding.

In one embodiment, the thickness of the third SAM layer 212 can range from about 0.3 to about 10 nm.

Figure 2G:
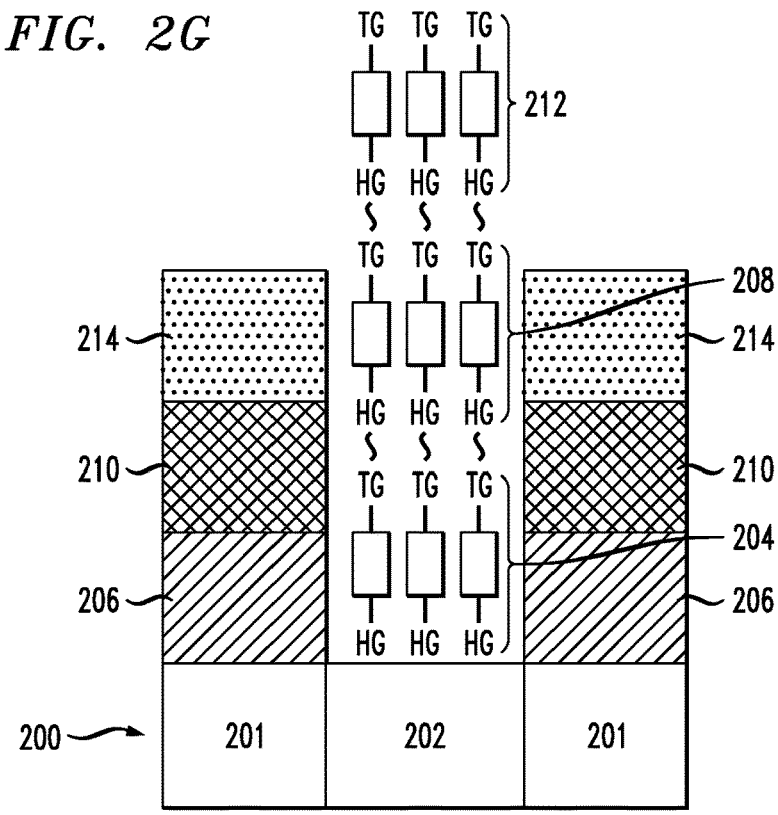
FIG. 2G schematically shows a cross-sectional view of selective film deposition on a substrate, in accordance with an illustrative embodiment.

The process flow 100 further includes, in step 114, depositing a dielectric layer 214 on each of dielectric layers 210, as shown in FIG. 2G. Suitable dielectric material for each of dielectric layers 214 includes any of the dielectric materials discussed above for first material 201. Dielectric layers 214 can be deposited using known methods such as, for example, ALD, CVD, PVD, PECVD, chemical solution deposition or other like processes plating. The top surfaces of dielectric layer 214 can then be planarized by, for example, CMP. In another embodiment, the thickness of dielectric layer 214 can range from about 0.5 nm to about 30 nm.

As one skilled in the art will readily appreciate, the process flow 100 can be repeated to add additional SAM layers and dielectric layers until a desired thickness is achieved. However, the SAM surface bonding reactivity will be reduced as the SAM thickness is greater than 20 nm. Practically, the total SAM vertical bonding is about 100 atoms (~30 nm) in vertical bonding. In one embodiment, the R group can be attached with functional —OH, —H and —C$_x$H$_y$—OH or even —NH$_x$ groups to form UV assisted lateral cross-linking bonding as above reactions to strengthen the cyclic long chain SAM.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method comprising:
    contacting a portion of a substrate with a first self-assembled monolayer forming molecule to attach a first self-assembled monolayer to the portion of the substrate, wherein the first self-assembled monolayer forming molecule includes a surface binding head group for attachment to the portion of the substrate and a binding tail group for attachment to a second self-assembled monolayer forming molecule;
    selectively depositing a first dielectric layer on the remaining portion of the substrate;
    contacting the first self-assembled monolayer with the second self-assembled monolayer forming molecule to attach the second self-assembled monolayer to the first self-assembled monolayer, wherein the second self-assembled monolayer forming molecule includes a surface binding head group for attachment to the binding tail group of the first self-assembled monolayer forming molecule and a binding tail group for attachment to a third self-assembled monolayer forming molecule; and
    selectively depositing a second dielectric layer on the first dielectric layer.

2. The method of claim 1, wherein the surface binding head group of the first self-assembled monolayer forming molecule and the second self-assembled monolayer forming molecule are the same or different and comprises one of a thiol group, a silane group, an alkene group, a carboxylic acid group and a phosphonic acid group.

3. The method of claim 2, wherein the binding tail group of the first self-assembled monolayer forming molecule and the second self-assembled monolayer forming molecule are the same or different and comprises one of a hydroxyl-containing end group, an amine-containing end group, a carboxylic acid-containing end group, a thiol-containing end group, and a $CH_3$-containing end group.

4. The method of claim 1, wherein the surface binding head group of the first self-assembled monolayer forming molecule is a thiol group and the substrate comprises one or more metals selected from the group consisting of copper, ruthenium, cobalt, rhodium, tantalum, nickel, gold, palladium, and platinum.

5. The method of claim 4, further comprising subjecting the first self-assembled monolayer forming molecule to ultraviolet curing.

6. The method of claim 1, wherein the first dielectric layer and the second dielectric layer are the same or different and comprises one or more of $SiO_2$, an ultra low-k dielectric material, a low-k dielectric material, and a high-k dielectric material.

7. The method of claim 1, wherein the first self-assembled monolayer has a thickness from about 0.3 nm to about 10 nm and the second self-assembled monolayer has a thickness from about 0.3 nm to about 10 nm.

8. The method of claim 7, wherein the first dielectric layer has a thickness from about 0.3 nm to about 10 nm and the second dielectric layer has a thickness from about 0.3 nm to about 10 nm.

9. The method of claim 1, further comprising:
    contacting the second self-assembled monolayer with the third self-assembled monolayer forming molecule to attach the third self-assembled monolayer to the second self-assembled monolayer, wherein the third self-assembled monolayer forming molecule includes a surface binding head group for attachment to the binding tail group of the second self-assembled monolayer forming molecule and a binding tail group for attachment to a fourth self-assembled monolayer forming molecule; and
    selectively depositing a third dielectric layer on the second dielectric layer.

10. The method of claim 9, wherein the surface binding head group of the third self-assembled monolayer forming molecule is the same or different as the surface binding head group of the first self-assembled monolayer forming molecule and the second self-assembled monolayer forming molecule and comprises one of a thiol group, a silane group, an alkene group, a carboxylic acid group and a phosphonic acid group.

11. The method of claim 9, wherein the binding tail group of the third self-assembled monolayer forming molecule is the same or different as the binding tail group of the first self-assembled monolayer forming molecule and the second self-assembled monolayer forming molecule and comprises one of a hydroxyl-containing end group, an amine-containing end group, a carboxylic acid-containing end group, a thiol-containing end group and a $CH_3$-containing end group.

12. The method of claim 9, wherein the third dielectric layer comprises one or more of $SiO_2$, an ultra low-k dielectric material, a low-k dielectric material, and a high-k dielectric material.

13. The method of claim 1, wherein the substrate comprises a central portion and a pair of outer portions, wherein the central portion comprises a metal and the pair of outer portions comprise the same or different dielectric material.

14. The method of claim 13, wherein the metal is selected from the group consisting of copper, ruthenium, cobalt, rhodium, tantalum, nickel, gold, palladium, and platinum.

15. The method of claim 13, wherein the dielectric material of the pair of outer portions are the same or different and comprises one or more of $SiO_2$, an ultra low-k dielectric material, a low-k dielectric material, and a high-k dielectric material.

16. The method of claim 1, wherein the first self-assembled monolayer and the second self-assembled monolayer extend radially outward from the substrate.

17. The method of claim 1, wherein contacting the portion of the substrate with the first self-assembled monolayer forming molecule comprises contacting the portion of the substrate with a solution comprising the first self-assembled monolayer forming molecule.

18. The method of claim 1, wherein contacting the portion of the substrate with the first self-assembled monolayer forming molecule comprises contacting the portion of the substrate with a gaseous first self-assembled monolayer forming molecule.

\* \* \* \* \*